(12) United States Patent  
Palagonia

(10) Patent No.: US 6,188,231 B1
(45) Date of Patent: Feb. 13, 2001

(54) METHOD FOR FORMING AN INTERPOSER FOR MAKING TEMPORARY CONTACT WITH PADS OF A SEMICONDUCTOR CHIP

(75) Inventor: Anthony Michael Palagonia, Underhill, VT (US)

(73) Assignee: International Business Machines Corporation, Armonk, NY (US)

(*) Notice: Under 35 U.S.C. 154(b), the term of this patent shall be extended for 0 days.

(21) Appl. No.: 09/453,130

(22) Filed: Dec. 2, 1999

Related U.S. Application Data

(62) Division of application No. 08/767,999, filed on Dec. 13, 1996, now Pat. No. 6,037,786.

(51) Int. Cl.⁷ .............................. G01R 31/02; H05K 3/02
(52) U.S. Cl. ........................................ 324/754; 29/846
(58) Field of Search .................. 324/754, 755, 324/757, 758, 765; 29/846, 842, 874; 438/613, 614

(56) References Cited

U.S. PATENT DOCUMENTS

| | | | |
|---|---|---|---|
| 4,585,991 | * 4/1986 | Reid et al. | 324/757 |
| 5,073,117 | 12/1991 | Mahli et al. | 439/71 |
| 5,118,299 | 6/1992 | Burns et al. | 439/74 |
| 5,177,439 | * 1/1993 | Liu et al. | 324/754 |
| 5,206,585 | 4/1993 | Chang et al. | 324/158 |
| 5,374,893 | 12/1994 | Koopman et al. | 324/754 |
| 5,457,344 | 10/1995 | Bartelink | 257/737 |
| 5,483,741 | * 1/1996 | Akram et al. | 29/846 |
| 5,500,605 | 3/1996 | Chang | 324/758 |
| 5,523,696 | 6/1996 | Charlton et al. | 324/758 |
| 5,528,159 | 6/1996 | Charlton et al. | 324/758 |

OTHER PUBLICATIONS

IBM Technical Disclosure Bulletin, vol. 16, No. 7, Dec. 1973 pp 2291& 2292 Gaind et al. Process For Etching Silicon.

* cited by examiner

*Primary Examiner*—Safet Metjahic
*Assistant Examiner*—Russell M. Kobert
(74) *Attorney, Agent, or Firm*—Robert A. Walsh

(57) ABSTRACT

An interposer for making a penetrating temporary contact between the contact pads of a chip having bumped or unbumped I/O pads and a test board for the purpose of testing said chip is disclosed. The interposer comprises a silicon substrate having sharp penetrating structures integrally formed at a predetermined depth in the silicon substrate along crystallographic planes. The resultant apparatus has a matching lateral thermal expansion to the chip being tested and provides uniform contact to all chip I/O pads.

9 Claims, 5 Drawing Sheets

METHOD FOR FORMING AN INTERPOSER FOR MAKING TEMPORARY CONTACT WITH PADS OF A SEMICONDUCTOR CHIP

This application is a division of Ser. No. 08/767,999 filed on Dec. 13, 1996 which has now issued as U.S. Pat. No. 6,037,786.

FIELD OF THE INVENTION

The present invention relates to the field of integrated circuit chip testing; more specifically, it relates to an apparatus for making a temporary electrical contact to the metal or solder bumps or bare contact pads of integrated circuit chips and the method of fabricating said apparatus.

BACKGROUND OF THE INVENTION

Integrated circuit chips are fabricated by forming an array of chips on silicon wafers and dicing the wafer to produce individual chips. The individual chips are then attached to chip carriers, ceramic or organic modules or circuit boards using various techniques, the most common methods include reflow solder or wire bonding. The reflow solder technique uses the reflow of Pb/Sn solder bumps (also known as C4 or controlled collapse chips connect) formed on the chip pads at wafer level to attach the chip. The other technique known as wire bonding or tape automated bonding (TAB)may be done by etching bumps on the leads or applying bumps (typically Al) to the chips. It is understood in the industry that when reference is made to .bumped chips. it usually refers to Pb/Sn solder bumps, or TAB bumped chips. The bumped chips may be mounted to carriers either individually (single chip modules) or in groups (multi-chip modules).

Certain reliability testing of semiconductor chips, known as .burn-in. testing and the like, requires prolonged power-up of the chip, often at elevated temperatures and voltages. While the chips may be easily functionally tested while in wafer form, this type of testing is difficult to do at wafer level due to problems associated with power distribution, wiring, and test channel density. These problems become even more difficult as I/O counts increase. Consequently burn-in testing has been traditionally done after the chips have been mounted and connected to the next level of packaging. A problem with this approach, however, is the cost of packaging chips that will fail such testing when attachments and wiring techniques are used that cannot be easily reworked. In this instance, reworks means removing a failing chip from the package and replacing it with another good chip. Subsequently the new chip must be burned in, forcing the other chips to undergo unnecessary additional stress. Therefore there is great advantage to be gained by individual chip (also known as bare die) testing.

Turning to the prior art, a socket for testing individual Pb/Sn solder bumped chips is described in U.S. Pat. No. 5,073,117 to Satwinder et. al., employing a plurality of cantilever beams extending from the periphery of the socket to contact individual solder bumps. However this approach is limited to testing chips having one or at most two or three rows of peripheral bumps and cannot be used with chips having an array of solder bumps extending into the interior portion of the chip surface.

U.S. Pat. No. 5,206,585 to Chang et. Al, describes a method of contacting an array of Pb/Sn solder bumps using a layer of anisotropic conductive material. The conductive column within the material forms a connection between individual bumps. The columns of conductors are described to be on 200 micron pitches. This is sufficient find for 100 micron bumps on 200 micron pitches, but is not fine enough when the bump size decreases 25 micron bumps on 50 micron pitches, which are commonly used. Also, only bumped chips can be tested by this method. Because the contacting method of this invention is non-penetrating of the bump, oxide formations on the bump and the attending contact resistance problem are concerns.

U.S. Pat. Nos. 5,523,696 and 5,528,159 both to Charlton et. al., describe a socket that can contact an array of Pb/Sn solder bumps using vertical dendritic growths or coated polymeric cones. This resolves the oxide problem by penetrating to the bulk material. A particular disadvantage of invention lies in the formation of the contacting structures produced. They are not regular in shape or pattern within an individual contact pad or from a contact pad to contact pads thus leading to a non-uniformity of contact pressure across all bumps of the array. This nonuniformity of pressure can increase the difference in contact resistance from bump to bump, affecting the testing as well as deform each bump differently, leading to attach problems when the chip is reflow attached to the carrier due to variations in flux inclusion within the bump.

It is well known in the art to temporally attach Pb/Sn solder bumped chips to a test substrate, perform the test, remove the chip by re-melting the bumps, and then reform the bumps. However, this technique, besides being expensive and potentially degrading the quality of the bump, does not work for chips designed to be wire or tab bonded. U.S. Pat. No. 5,374,893 to Koopman et. al., describes a similar technique by forming a sacrificial layer on a temporary substrate to reflow Pb/Sn solder bumps to attach to the chip. After testing, the sacrificial layer is dissolved into the C4. Using this approach, the temporary substrate must then be reworked after each use.

Still another concern of individual chip level testing is the difference in lateral coefficients of expansion between the chip and test socket or interposer used within the socket. This difference can deform the soft Pb/Sn bumps leading to chip attach problems during reflow or produce very large deformations in chip pad surfaces making wire or tab bonding unreliable. U.S. Pat. No. 5,457,344 to Bartelink describes a contacting fixture that compensates the differences due to thermal expansion. The connector however is relatively complicated, fragile and expensive to fabricate.

Therefore, there is a need in the industry for a method of contacting both bumped and non-bumped individual chips reliably and with minimum impact to the chip.

SUMMARY OF THE INVENTION

To overcome the problems described above, it is an object of the present invention to provide an interposer for making a penetrating temporary contact between the I/O pads of a chip having bumped or unbumped contact pads and a test board for the purpose of testing the chip. It is a further object of the present invention that the interposers have a matching lateral coefficient of expansion to that of the chip to be tested so as to minimize the disruption of the solder bumps and the surface of the contact pad. It is a still further object of this invention that the penetrations of the bulk material are uniform on all chip pads thereby providing uniform contact resistance to all chip contact pads and in the case of bumped contact pads to provide uniform and controlled bump deformation.

According to the present invention, an interposer is used that provides penetrating contact pads etched into a silicon substrate. The pads are connected by conductive lands to a plurality of peripheral pads which may be wire, tabs bonded or otherwise connected to a test board subassembly. The uniformity and shape of the contact pads are determined by the crystallographic structure of the silicon. The interposer fabrication is performed using silicon wafer and semiconductor processing techniques described hereinafter.

DETAILED DESCRIPTION OF THE INVENTION

The following is a description of the preferred embodiment of the present invention. The same numerals will be used to identify the same elements in different figures to facilitate the understanding of the invention.

Figure 1:
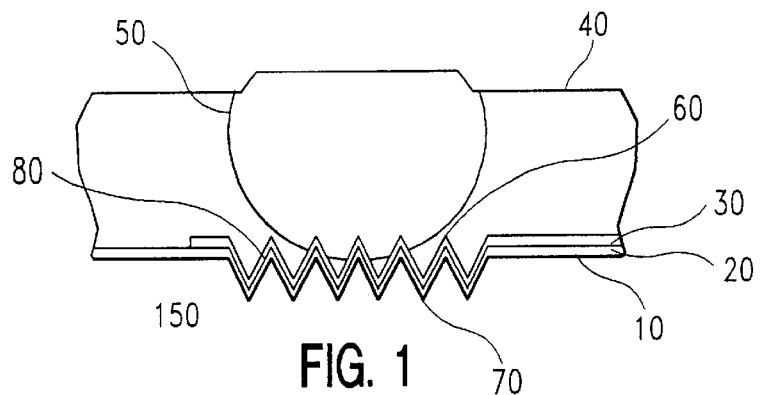
FIG. 1 is a schematic sectional side view showing a contact pad of an interposer in contact with a solder bump according to a first embodiment of the present invention.

FIG. 1 illustrates a cross-section view through a contact pad portion of the interposer according to the present invention illustrating the penetration of the contact with a Pb/Sn solder bump. The interposer contact is made of a series of parallel grooves, each groove defined by a peak 60, a sidewall 80 and a trough 70. The contact is constructed in a silicon substrate 150 having a surface 10. An insulator layer 20 of $SiO_2$, or other suitable insulator is formed over the surface 10 of the silicon substrate. A patterned conductor layer 30 of Al, Cu, Pd, Ni, Pt, Cr, Mo or W, or a composite film such as Cu/Ni, Al/Cu/Cr or combination thereof is deposited over a portion of the insulator layer 20 in the contact region of the silicon. Pb/Sn solder bumps 50 attached to semiconductor chip 40 to be tested is shown as pressed into the contact pad under pressure. While pluralities of peaks are illustrated, it is understood that one may suffice.

Figure 2:
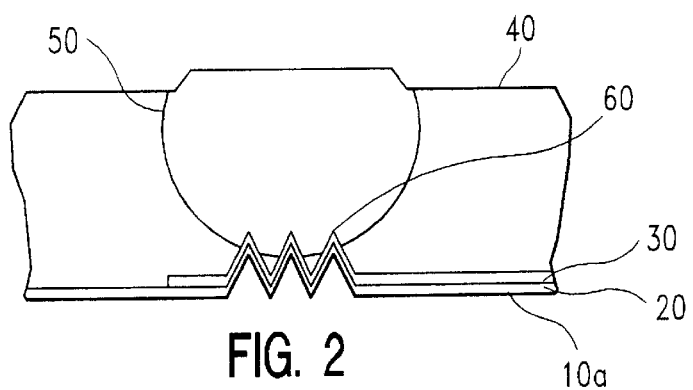
FIG. 2 is a schematic sectional side view of another contact pad of the interposer in contact with a solder bump according to a second embodiment of the present invention.

FIG. 2 shows a second embodiment of a contact pad portion of the interposer of the invention. In this embodiment the tips of the contact pad grooves are raised above the surface 10a of the silicon substrate. This allows the contact pads to take up less area of an interposer surface and be more densely arranged. Though illustrated with a bumped chip, the second embodiment is particularly well suited to contact and test of non-bumped chip pads.

Figure 3:
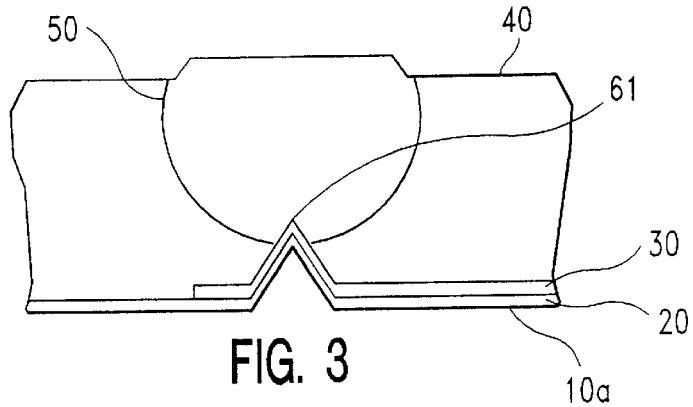
FIG. 3 is a schematic sectional view of another contact pad of the interposer in contact with a solder bump according to a third embodiment of the present invention.
Figure 4:
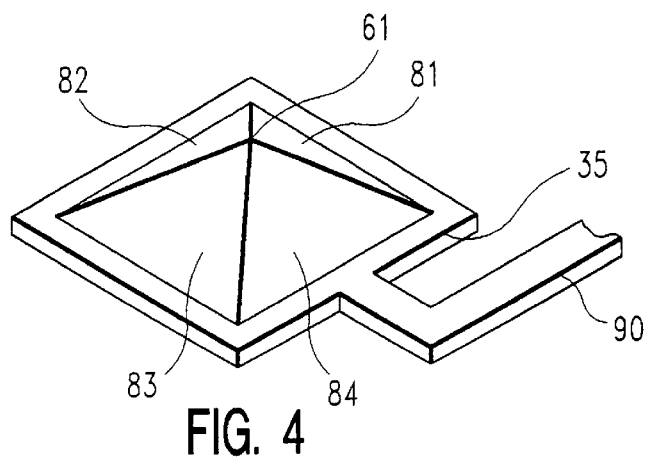
FIG. 4 is an isometric view of the contact pad shown in FIG. 3.

FIG. 3 illustrates a third embodiment of the contact pad portion of the interposer. In this embodiment the series of parallel grooves has been replaced by a pyramidal structure 61 having a single peak or tip which is illustrated more clearly in FIG. 4. The pyramidal contact 16 has a single tip or peak and sides 81, 82, 83 and 84. The conductor layer 30 has been patterned to form contact pad 35 which is attached to conductive land 90. Again, though illustrated with a bumped chip, this embodiment is particularly well suited to contact non-bumped chip pads. Your attention is now directed to the fabrication of the interposer which is illustrated in FIGS. 5A through 5I with special emphasis on the contact portion of the interposer which was discussed above in connection with FIG. 1.

Figure 5A:
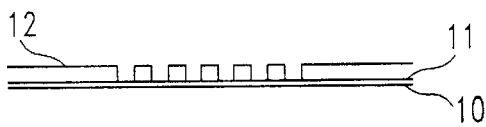
FIGS. 5A through 5I illustrate the process sequence for fabricating the first embodiment of the present invention.
Figure 5B:
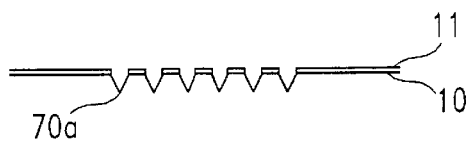

As shown in FIG. 5A the silicon substrate 150 has had sacrificial oxide layer 11 formed on surface 10 and a first resist layer 12 patterned to mask the oxide layer 11. This layer may be from 500 to 2000 Å thick. The thickness is not critical and may be a thermal oxide or deposited $SiO_2$. FIG. 5B illustrates when the oxide has been etched by conventional means using HF or buffered HF or suitable dry etch techniques, and the resist 12 has been stripped away using techniques well known in the art. It should be noted that the silicon substrate is partially etched away at this point.

The silicon substrate preferably has a <100> crystal orientation and the etchant used would be a very strong base. It is known in the art that strong bases will etch silicon at different rates along different crystal planes. If the wafer is of <100> orientation, the preferred 'V' shaped patterns illustrated will result. IBM Technical Disclosure Bulletins Vol. 16, No. 7, pages 2291–2292, December 1973 entitled *Process for Etching Silicon*, which is incorporated herein by reference, describes one such etch. The etchant by way of example may be composed of 450 grams of tetramethyamonium hydroxide pentahydrate dissolved in 1 liter of water. Using such an etchant at temperatures of 65–76° C. the etched rate of <100> silicon in the vertical direction is in the range of 3000 to 4000 Å per minute, while the lateral etch rate is approximately ⅙ of that. It should be understood that both temperature and concentration of etchant control the etch rate. The sidewalls produced have a slope of approximately 55° when measured internally or 35° when measured from a line perpendicular to the surface. Other etchant material may be used that are well known in the art such as alcoholic KOH (20% Aqueous KOH saturated with isopropanol at 80° C.) and Ethylenediame/Pyrocatechol/ water mixtures. As pointed out earlier, the etched rate will be determined by the temperatures used.

Since the interposer body comprises silicon, the same material as the semiconductor chip, the amount of lateral thermal expansion or contraction will be the same for both the chip and the interposer. This relationship prevents shear or tearing forces to be applied to the bump or chip pad as heat is generated during tests. Further since the present invention utilizes etching technology on a particular crystal orientation <100> of silicon, we are able to control the shape of the etched grooves, thereby forming all the grooves or pyramidal structures to be nearly identical in height, size and sharpness. This configuration creates more uniform penetration of the bump or pad, thereby improving the overall results as will be discussed hereinafter.

Figure 5C:
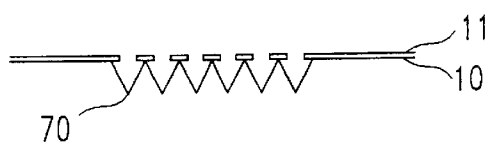
Figure 5D:
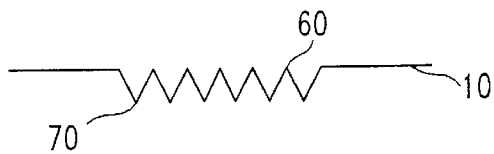

FIG. 5C illustrates where the silicon etch is complete and acid is applied to remove the sacrificial oxide layer. FIG. 5D shows the structure after the sacrificial oxide has been removed. Though the ridge and trough are both shown sharply defined, the trough may have a slightly flattened profile. The exact geometry of the groove is determined by the oxide pattern and the etch time. The nominal etch time is defined as that time needed to form a sharp ridge profile. For example, to form ridges 5 microns apart, the oxide mask should be 1.2 microns wide, on 5 micron pitch and the etch time using the etch described above should be 9 minutes. The grooves will be approximately 3.6 microns deep. If the oxide mask is 4.8 microns wide in 20 micron centers, nominal etch time is 36 minutes and the grooves will be 14.4 microns deep.

Figure 5E:

An insulating layer is then formed over the entire transposer surface as shown in FIG. 5E. This insulating layer should be conformal and may be created using conventional LPCVD oxide, or sputtered oxide, a deposited metal oxide, or a thin thermal oxide technique. The insulator may also be a composite layer formed by an oxide/silicon nitride material. Thickness may range from 500 to 1000 Å for grooves 3 to 4 microns deep to 2000 to 5000Å thick for 14–15 microns deep grooves.

Figure 5F:
Figure 5G:
Figure 5H:
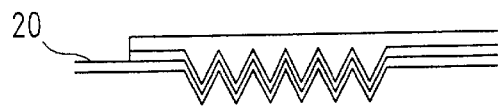
Figure 5I:
Figure 9:
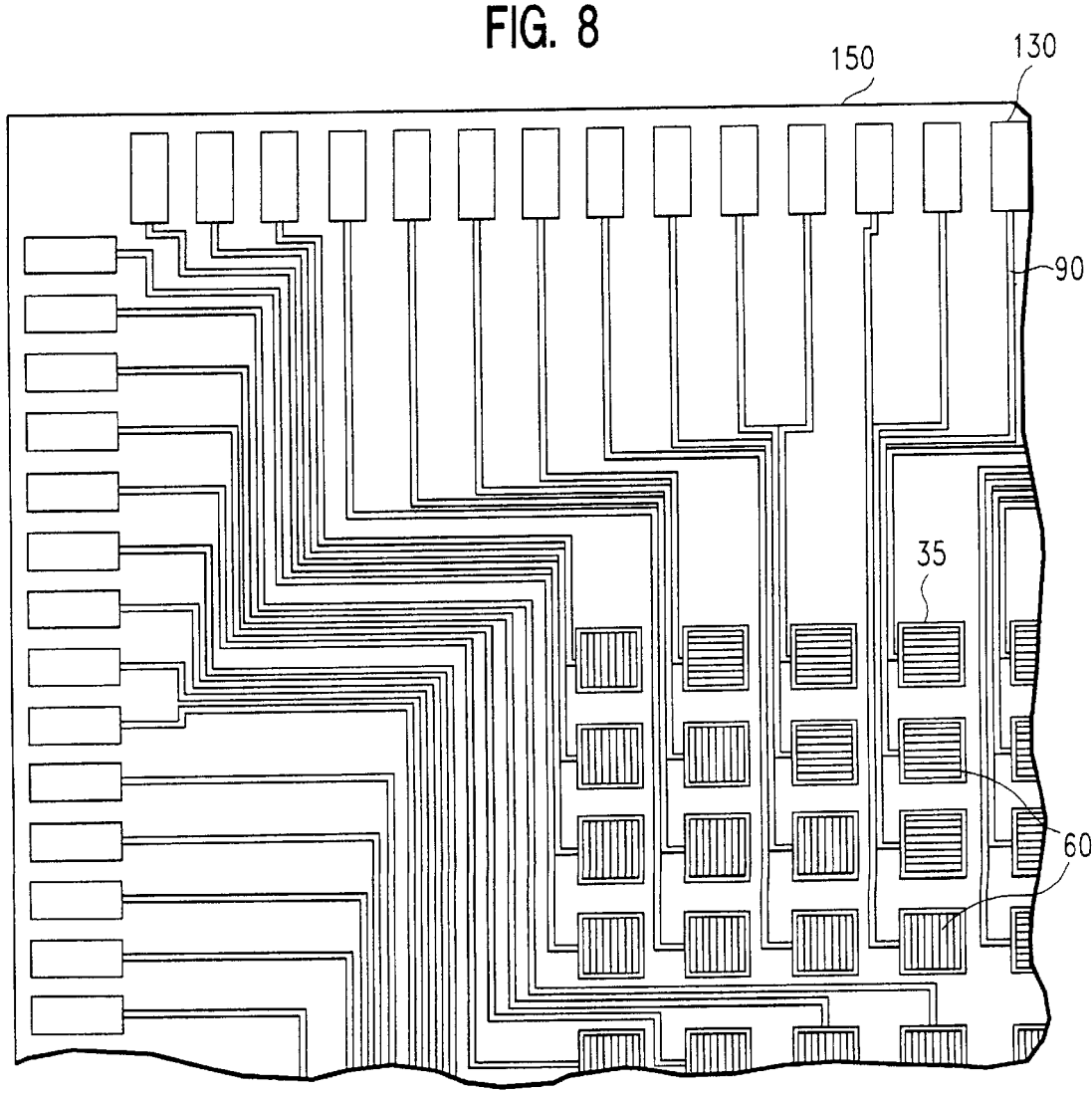
FIG. 9 is a top plan view of the interposer showing contact pads, peripheral pads and interconnecting lands.

A conductive film is next deposited using conventional techniques on top of the insulating layer as shown in FIG. 5F. This conductive layer may be a metal such as Pd, Ni, Pt, Cr, Mo or W, or a composite film such as Cu/Ni, Al/Cu/Cr or combination thereof. The main requirement of this film is that it is compatible with the chip under test and not alloy significantly with the bump material in the case of bumped chips, or the pad material in the case of unbumped chips, at the temperature the testing is conducted at and that it is conformal. Thickness of the conductive layer between 2000 and 6000 Å is preferable. A second resist has been applied and patterned, as shown in FIG. 5G, and a portion of the conductive film 30 is removed by wet chemical etching as shown in FIG. 5H. Referring to FIG. 9, the conductor is left over the contact pad 35 and also forms a peripheral pads 130, and connecting lands 90. Suitable wet metal etchant is commonly used which include $HNO_3/H_3PO_4$/Acetic for Al, $HNO_3$/HF for W, $HNO_3$ or $HClO_4$ for Pd. An alternative to the steps shown in FIGS. 5F through 5H would be to form the conductive structures by liftoff technique or evaporation through a metal mask. Finally, the photo resist 14 is removed by conventional techniques to complete the penetrating contact pad region as shown in FIG. 5I.

Figure 6:
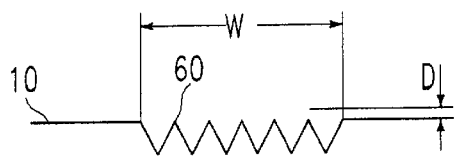
FIG. 6 is a schematic diagram showing the relationship between the height of the contact pad and the surrounding surface.
Figure 7A:
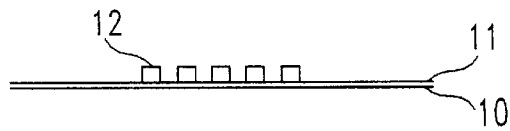
FIGS. 7A thru 7I illustrate the process sequence for fabricating the second and third embodiments of the present invention.
Figure 7B:
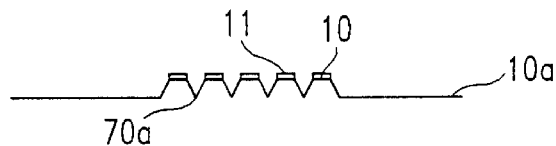
Figure 7C:
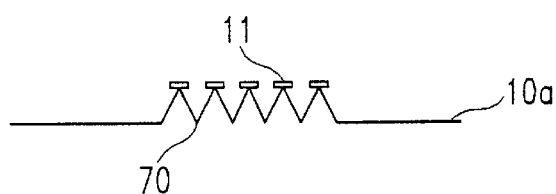
Figure 7D:
Figure 7E:
Figure 7F:
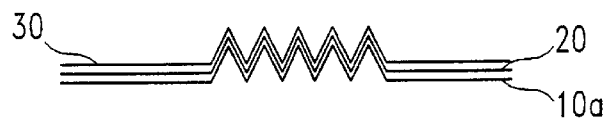
Figure 7G:
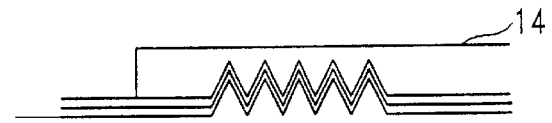
Figure 7H:
Figure 7I:
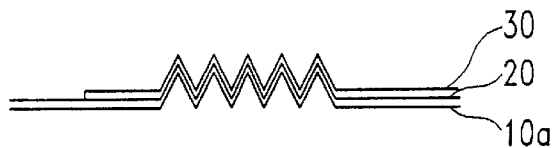

FIG. 6 illustrates a detail about the silicon etching as described above. Because a certain amount of over-etch, over and above the nominal etch time, the ridge 60 will be some distance D below the silicon surface 10. This configuration is useable only for bumped chips because the bumps will engage the interposer below the surface of the silicon substrate. Further the distance W, must be wide enough to accommodate the size of the Pb/Sn bump. For example, 100 micron diameter Pb/Sn bumps require W to be 80 to 100 microns, and 25 micron diameter Pb/Sn bumps require W to be 20 to 25 microns.

Another embodiment of the present invention will now be discussed in connection with FIGS. 7A through 7D which illustrate the contact portion of the interposer in accordance with the present invention. In this embodiment the ridge or peak of the groove 60 is higher than the surrounding silicon surface 10a. The trough 70 is coplanar with surface 10a. It will be noted in FIGS. 7A through 7D that the oxide mask 12 is formed only over the regions of silicon that are to become ridges or peaks of the grooves or the tip of the pyramid of FIG. 4. Thus the original silicon surface 10 is etched back to a new silicon surface 10a as the grooves are formed. Subsequent processing as illustrated in FIGS. 7E through 7I is identical to those processes illustrated and discussed in connection with FIGS. 5E through 5I.

It should be readily apparent that the raised contact pad structure of this embodiment can be used to contact chips having unbumped pads as well as allowing smaller pad sizes when used for bumped chips. Reducing the size of the contact pads would also beneficially increase the space between them. This is important as chip pad array sizes increase and the land connecting the contact pads to the peripheral pads of the interposer must pass between the contact pads as shown in FIG. 9.

Figure 8:
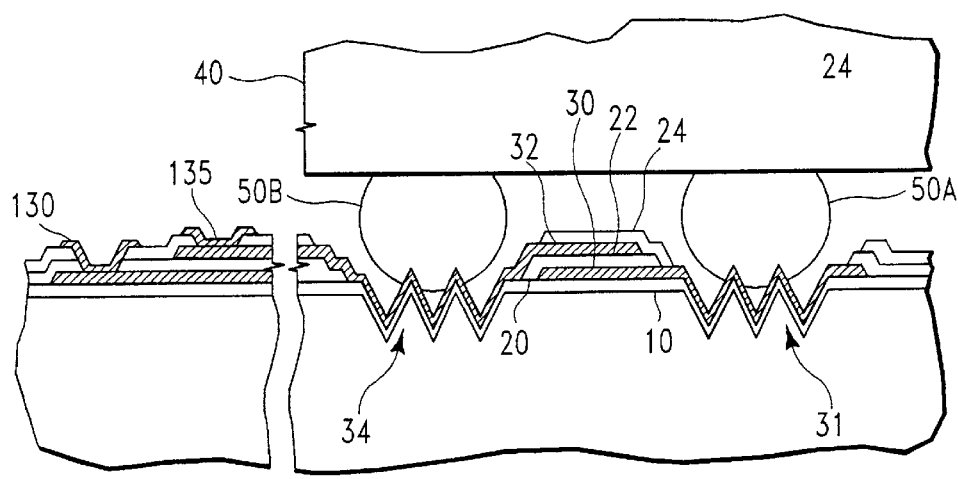
FIG. 8 is a schematic sectional view showing the formation of electrical connections to the contact pads and the peripheral pads of the interposer.

FIG. 8 illustrates another embodiment of the present invention. In the earlier embodiments, one layer of conductors was used to connect the contact pads to the peripheral pads. In this embodiment two or more conductive layers of metal are used to connect to two or more rows of peripheral pads. A first insulator layer 20 insulates the first conductive layer 30 from the silicon surface 10. Conductor layer 30 connects contact pads designated 31 with peripheral pad 130. Second insulator layer 22 insulates first conductor layer 30 from second conductor layer 32. Conductor layer 32 connects contact pads designated 34 with peripheral pad 135. An optional insulator layer 24 may cover conductor layer 32 between bumps 50a and 50B.

Turning again to FIG. 9 which illustrates the top view of a corner of the interposer 150, peripheral pads 130 are arranged along the periphery of the interposer. Contact pads 35 are arranged in a pattern matching the chip pads in the interior of the interposer. The peripheral pads are connected to the contact pads by lands 90. It should be noted that ridges 60 are clearly defined. The ridges shown are running in two directions. While this is not critical, it helps to prevent slipping of the chip to one side. Another method to accomplish this is to etch concentric square rings instead of parallel grooves in the silicon. Marks produced on Pb/Sn solder bumps will collect flux during subsequent reflow and attach processes. This flux can become incorporated into the joint. The pyramidal configuration shown in FIGS. 3 and 4 minimize this effect by making one dimple on a Pb/Sn solder bump.

Figure 10:
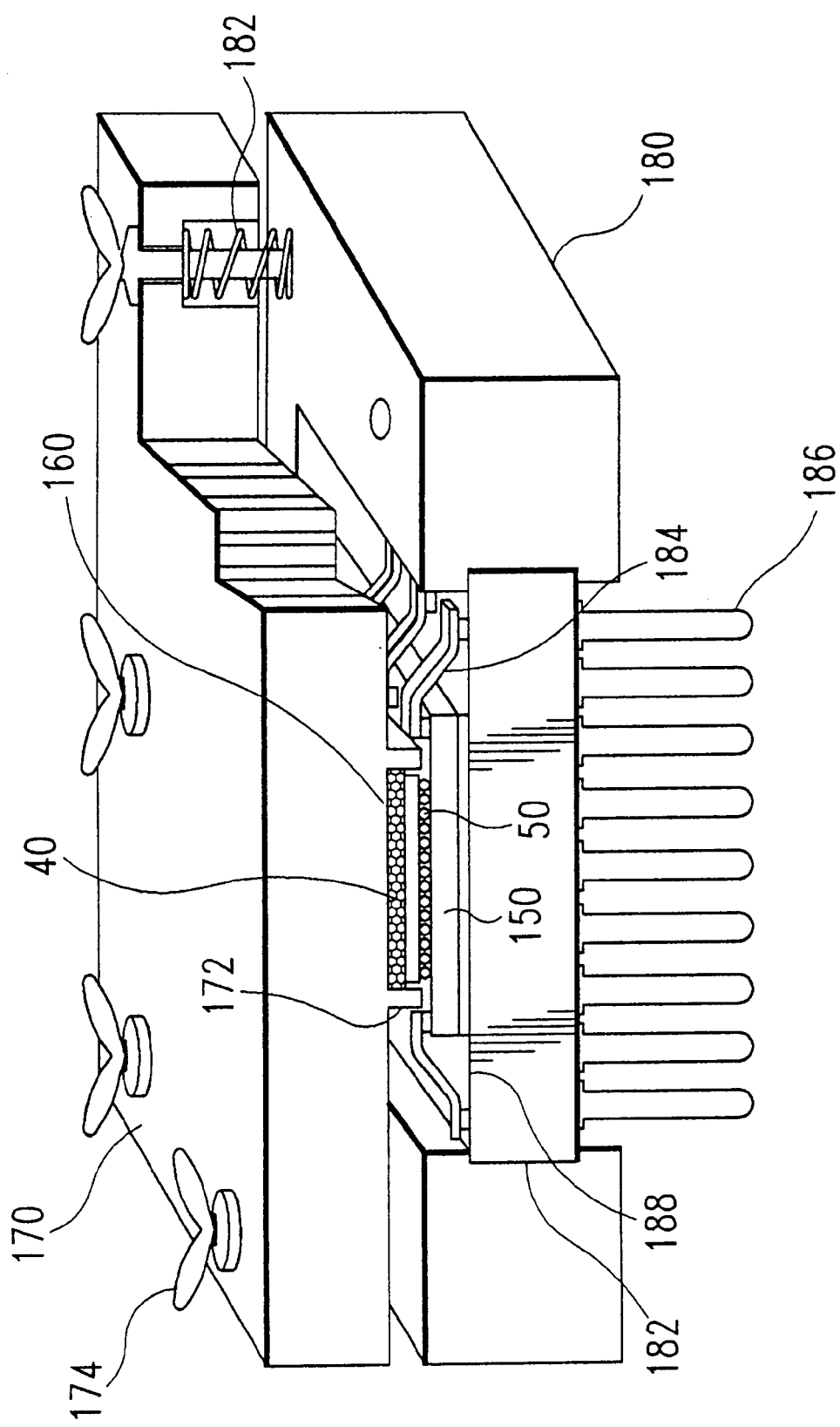
FIG. 10 is an isometric view with parts broken away showing the use of the present invention in a single chip test socket.

FIG. 10 illustrates a typical mounting arrangement of the interposer in a socket holder during a .burn-in. test operation. Lower socket body 180 holds a multi-layer ceramic 182 having external pins 186. Transposer 150 is mounted onto the surface of ceramic 182 by resilient high temperature adhesive (i.e., high temperature silicon rubber). Conductors 184 connect the peripheral pads of transposer 150. Upper socket body 170 has a cavity formed by protrusions 172 into which chip 40 to be tested is mounted.

Optional soft conductive foil 160 between the chip and upper body provides uniform pressure when screws 174 attach upper body 170 to lower body 180. Springs 182 provide the force to cause the interposer contact pads to penetrate the bump 50 of the chip being tested. The socket body may be made of composite insulating plastic.

While the invention has been described as contacting single chips, the interposer may be constructed to contact multiple chips simultaneously or portions of undiced wafers containing multiple chips, or entire wafers of undiced chips.

Thus, an interposer for making temporary contact to a semiconductor chip during tests has been described, as well as the method of making same. As may now be appreciated, the interposer places no lateral stresses on the semiconductor chip during the testing process. Further uniform contact is made to each chip pad. Therefore, uniform pressure may be applied because all contact pads are uniformly formed and penetrate equally into the pad. The interposer according to the present invention is useful for both chips having Pb/Sn or Al I/O pads or chips having unbumped I/O pads.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

What is claimed is:

1. A method of fabricating an interposer for making temporary contact with contact pads of a semiconductor chip, comprising the steps of:

etching a silicon substrate along crystallographic planes to form a plurality of V-groove regions with sharp ridges and troughs which interact with the contact pads, the regions having a predetermined depth and arranged on a surface of said silicon substrate in juxtaposition to the contact pads, the regions have a uniform geometry;

forming a thin conformal insulator layer over said silicon substrate; and forming a plurality of electrically integral conductive lines having a first end conformally coating at least one region, a second end terminating in a pad arranged in at least one row at a periphery of said silicon substrate and a middle portion connecting said first and second ends.

2. A method according to claim 1, wherein said silicon substrate has a <100> crystal orientation relative to said top surface.

3. A method according to claim 2, wherein said regions comprises a plurality of parallel grooves forming at least one ridge.

4. A method according to claim 3, wherein said contacting structures have sidewall slopes of approximately 55° forming a ridge angle of approximately 70°.

5. A method according to claim 1, wherein said regions are pyramidal in shape.

6. The method of claim 1, further comprising the steps of:

forming at least one additional thin conformal insulator layer over said silicon substrate; and forming at least one additional set of conductive lines conformally coating an additional selected subset of said contacting structures at a first end, terminating in a pad at the periphery of said silicon substrates at a second end.

7. A method according to claim 1, wherein said regions include first sub-regions having a plurality of parallel V-grooves forming sharp ridges and troughs and second sub-regions having a plurality of parallel V-grooves forming sharp ridges and troughs, said plurality of grooves of said second sub-regions orientated perpendicular to said plurality of grooves of said first sub-regions, a portion of the V-grooves of both sub-regions being above the surface of the substrate.

8. A method according to claim 7, wherein said first and second sub-regions are defined using one masking step.

9. A method according to claim 8, wherein said masking step comprises patterning a resist layer using one photolithographic mask.

* * * * *